United States Patent
Perroni et al.

(10) Patent No.: US 8,750,047 B2
(45) Date of Patent: Jun. 10, 2014

(54) CIRCUIT FOR READING NON-VOLATILE MEMORY CELLS HAVING A PRECHARGING CIRCUIT ACTIVATED AFTER THE ACTIVATION OF A SENSE CIRCUIT

(75) Inventors: Maurizio Francesco Perroni, Furnari (IT); Giuseppe Castagna, Palermo (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 363 days.

(21) Appl. No.: 13/161,248

(22) Filed: Jun. 15, 2011

(65) Prior Publication Data

US 2011/0305096 A1   Dec. 15, 2011

(30) Foreign Application Priority Data

Jun. 15, 2010   (IT) .............................. MI2010A1080

(51) Int. Cl.
   *G11C 16/28*   (2006.01)
(52) U.S. Cl.
   USPC ............... 365/185.21; 365/185.2; 365/185.25

(58) Field of Classification Search
   USPC ............... 365/185.03, 185.19, 185.2, 185.21, 365/185.25
   See application file for complete search history.

(56) References Cited

U.S. PATENT DOCUMENTS

| | | | |
|---|---|---|---|
| 6,191,978 B1 | 2/2001 | Watanabe et al. | |
| 6,324,112 B1 | 11/2001 | Fournel | |
| 7,218,548 B2 * | 5/2007 | Kang et al. | 365/149 |
| 7,272,059 B2 * | 9/2007 | Vimercati et al. | 365/203 |
| 2005/0030809 A1 | 2/2005 | Vimercati et al. | |
| 2008/0084758 A1 | 4/2008 | Wang | |

* cited by examiner

*Primary Examiner* — Andrew Q Tran
(74) *Attorney, Agent, or Firm* — Seed IP Law Group PLLC

(57) ABSTRACT

A circuit for reading memory cells includes: a sense node connectable to a memory cell; a sense device connected to the sense node and configured to be activated in a precharging step which precedes a cell reading step and to provide such an output signal to assume logic values dependent on an electric signal present at the sense node; a precharging circuit connected to the sense node and configured to be activated to make the sense node reach a precharging voltage and to be deactivated upon the output signal switching in the precharging step.

19 Claims, 5 Drawing Sheets

CIRCUIT FOR READING NON-VOLATILE MEMORY CELLS HAVING A PRECHARGING CIRCUIT ACTIVATED AFTER THE ACTIVATION OF A SENSE CIRCUIT

BACKGROUND

1. Technical Field

The present disclosure refers to the non-volatile memory field, and in particular it refers to techniques for reading such memories.

2. Description of the Related Art

As it is known, for non-volatile memories (wherein the memory cell includes a floating gate MOS transistor) reading cells includes: decoding the addresses of the memory cell to be read, routing the voltages for biasing the row and column lines identifying the cell, sensing the cell contents, including buffering the read data, which will be thereafter made available on the output pin of the memory.

The step of sensing is carried out by a sense amplifier comprising, typically, a differential amplifier provided with an input node to be connected to the cell to be read. The differential amplifier output depends on the electric signal present in the input node thereof, in turn dependant on the stored data in the memory cell.

Moreover, the sense amplifier may be provided with a comparator which, based on the signal detected by the differential amplifier, returns the logic value corresponding to the read data. The differential amplifier operates with a preset voltage value on its input node.

US-A-2005-0030809 discloses, inter alia, a sense circuit which operates according to the "voltage ramp" technique. This sense circuit provides a current injection at the input node of a differential amplifier, carried out by both a precharging circuit and the output of the sense amplifier itself, which is connected to the input node by a feedback resistor. According to this technique, the precharging circuit is actuated at the same time as the differential amplifier, before the real sensing step starts and it is deactivated at the end of the sensing step.

The Applicant recognizes that such a sense amplifier involves the presence of two current absorption peaks which occur at the power-up and down of the sense amplifier, respectively.

BRIEF SUMMARY

The Applicant has noticed the switching on the sense amplifiers is particularly important, since the resulting abrupt absorption of current may cause some noise on the supply voltage, to which a possible reading fault is associated. Further, such a phenomenon becomes worse in case of memory systems operating in a "dual work" mode, wherein a memory bank is reading while another memory bank is checking, during a programming operation.

For example, charging the bit line the differential amplifier may be performed using a bias current on the order of tens of μA. According to this example, in a memory system having 140 sense amplifiers, the current of only the sense amplifier exceeds the mA with a starting peak of tens of mA.

The Applicant has noticed that the reading circuits of the prior art do not provide any solutions capable of satisfactorily joining a not-excessive circuit complexity to a reduction of the noise effects on the supplies resulting from the sense device activation.

One embodiment of the present disclosure comprises a reading circuit that includes:

a sense node configured to be coupled to a memory cell to be read;

a sense device coupled to the sense node and configured to provide an output signal with logic values depending on an electric signal present at the sense node;

a precharging circuit coupled to the sense node and configured to charge the sense node to a precharging voltage; and a timing device configured to activate the sense device with a first control signal and activate the precharging circuit with a precharge activation signal, delayed from the activation of the sense device.

In one embodiment, the precharging circuit comprises:

a signals combining logic module configured to receive a second control signal and the output signal and provide an activation/deactivation signal based on the second control and output signals; and a precharging current generating circuit configured to be activated and deactivated based on the activation/deactivation signal.

One embodiment is a memory system that includes the reading circuit in addition to a memory array, including a plurality of memory cells to be read, a row address decoder coupled to the memory array, and a column address decoder coupled to the memory array.

One embodiment is a method for reading non-volatile memories and includes:

providing, using a sense device having a sense node coupled to a memory cell, an output signal with logic values depending on an electrical signal present at the sense node;

activating the sense device; and activating a precharging circuit configured to precharge the sense node, wherein activating the precharging circuit is delayed from activating the sense device.

BRIEF DESCRIPTION OF THE SEVERAL VIEWS OF THE DRAWINGS

Further characteristics and the advantages of the disclosure will result from the following description of a preferred embodiment and variants thereof provided only as a way of example, with reference to the appended drawings, wherein.

DETAILED DESCRIPTION

Figure 1:
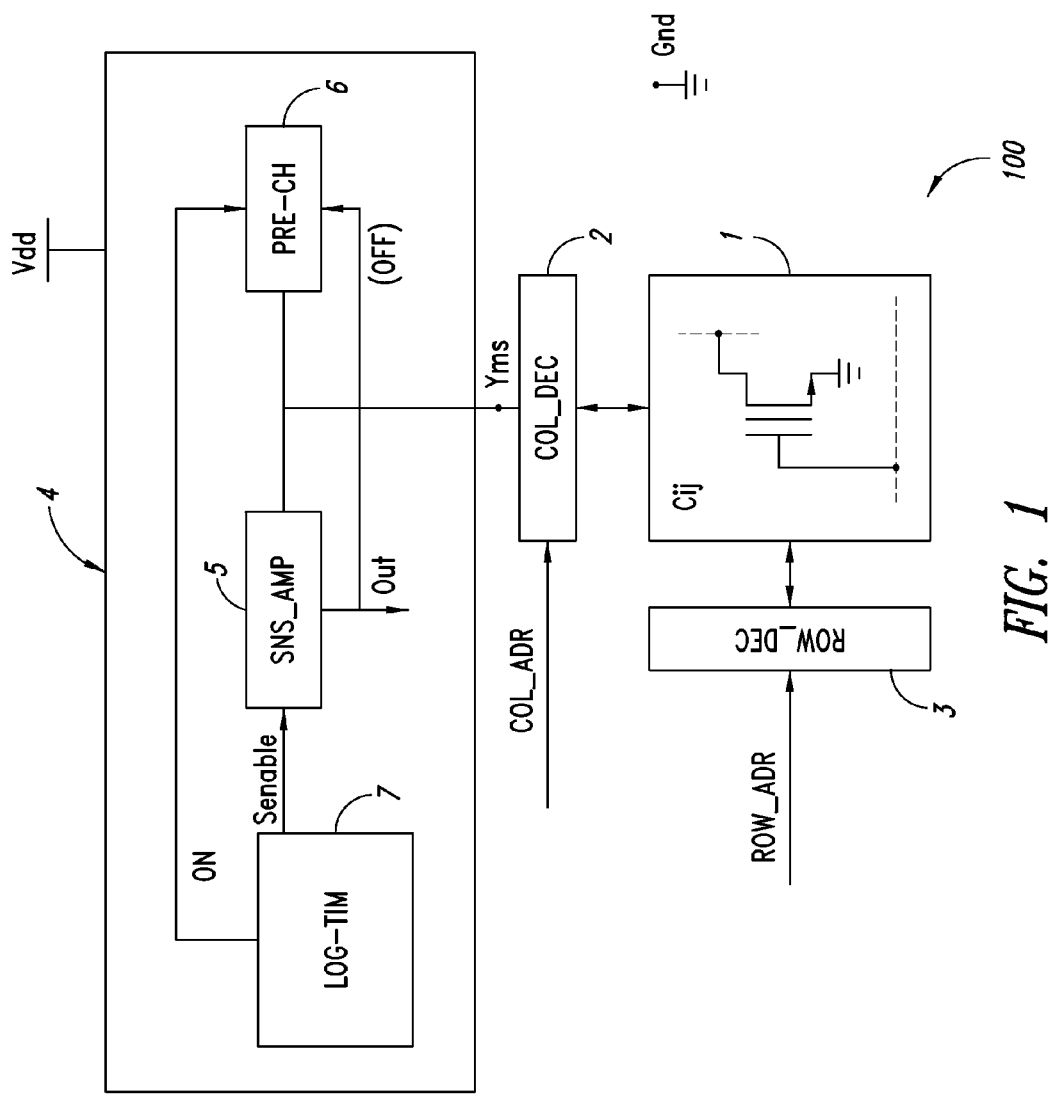
FIG. 1 shows by means of functional blocks a particular embodiment of a memory system comprising a reading circuit.

FIG. 1 schematically shows a memory system 100 comprising a memory device 1, a column decoder 2, a row decoder 3, and a reading circuit 4. The memory device 1 includes an array of non-volatile memory cells comprising a plurality of memory cells (in FIG. 1, for sake of simplicity, only one cell $C_{ij}$ is shown) arranged in rows and columns.

For example, the memory cells are of the floating gate MOSFET (Metal Oxide Semiconductor Field Effect Transistor) type, for which a cell $C_{ij}$ under an unprogrammed condition has a low threshold voltage (for example, associated with the logic value 1). Programming the cell occurs by injecting electric charges in the floating gate and causing thereby a high threshold voltage (associated, for example, with a logic value 0).

The memory system 100 is for example an EPROM (Electrically Programmable Read Only Memory) and in particular it is a Flash memory, such as an EPROM (Electrically Erasable PROM) and it may have a NAND-type structure, or preferably a NOR-type structure.

According to the NOR architecture, the source terminals of the memory cells $C_{ij}$ are connected to a common source line, typically connected to ground Gnd; the gate terminal of the cells $C_{ij}$ belonging to the same row are connected to one and the same word line. The drain terminals of the memory cells $C_{ij}$ of each column are connected to a corresponding bit line; the bit lines are operatively grouped in packets (for example packets of 16 cells).

The column decoder 2 (COL_DEC) is structured to select one or more bit lines of a word, as a response to a column address COL_ADR. The row decoder 3 (ROW_DEC) is structured to select a word line in accordance with a row address ROW_ADR. The column decoder 2 is connected to the reading circuit 4, which is configured for returning as an output a word read from the memory array 1.

According to the embodiment of FIG. 1, the reading circuit 4 comprises a sense device (SNS_AMP) 5 and a precharging circuit 6 (PRE-CH). The sense device 5 is connected to a sense node Yms which is intended to be put in connection to the drain terminal of a cell to be read $C_{ij}$ of the memory device 1.

The sense device, typically a sense amplifier 5, is configured to provide an output signal Out on a homonymous output terminal. The output signal Out is such to assume logic values dependant on an electric signal present at the sense node Yms. The sense circuit 5 is configured to be activated/deactivated by a first drive signal Senable. Upon the completion of the reading of the cell $C_{ij}$, the output signal Out expresses the logic value corresponding to the stored value on a cell during the reading itself.

The precharging circuit 6, also connected to the sense node Yms, is such to charge the sense node Yms to a preset voltage value, to be reached before starting to read the cell. The precharging circuit 6 is configured to be activated by a second drive signal ON and it is configured to be deactivated upon switching the output signal Out of the sense device 5. The reading circuit may comprise a plurality of sense devices (not shown) each associated to a different memory cell or to a different bit line.

The reading circuit, supplied with a voltage Vdd, is also provided with, according the example in FIG. 1, a timing device 7 (LOG-TIM), implementable by logic, structured for generating, inter alia, also the first and the second drive signals, Senable and ON.

Figure 2:
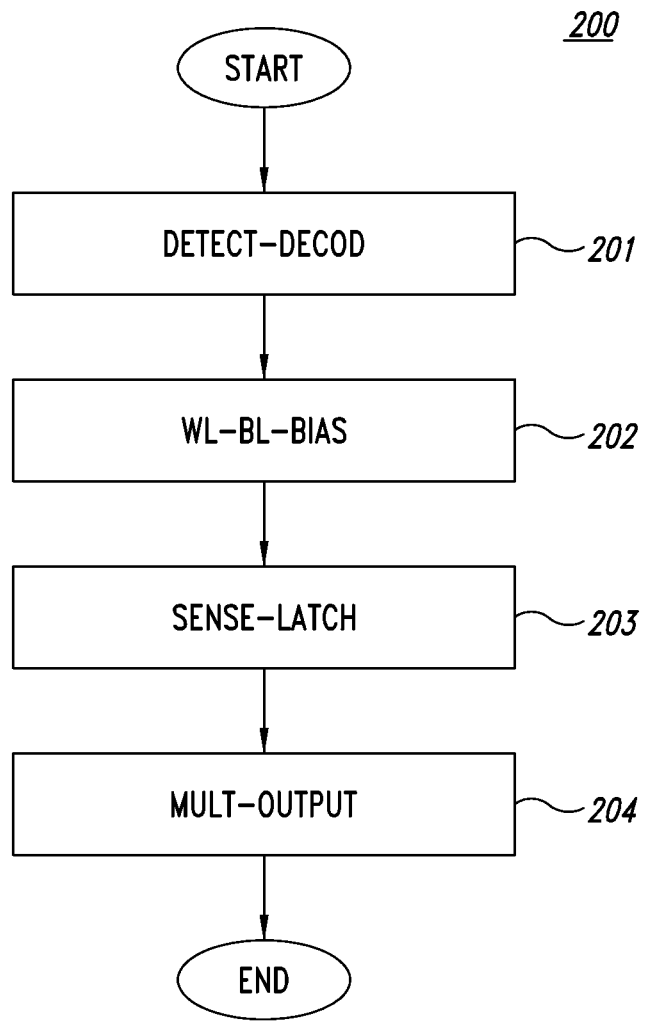
FIG. 2 shows by means of a flow chart an exemplary method for reading a memory cell of said memory system.

In FIG. 2 a schematic flow chart is shown, an exemplary reading method 200 of the memory system 100 in FIG. 1. The method 200 comprises, after a symbolic start step START, a first step 201 (DETECT-DECOD) of detecting a transition on a reading signal Read_Strobe, from, for example, an external logic, which is for causing the subsequent reading steps. After the detection of the transition in the reading signal, the column decoder 2 and the row decoder 3 decode the column and row addresses of the memory cells $C_{ij}$ to be read.

A second step 202 (WL-BL-BIAS) includes biasing the word line connected to the gate terminals of the memory cells identified by the row address and precharging the sense nodes Yms intended to be connected, in the subsequent reading step, to the drain terminals of the memory cells $C_{ij}$ identified by the column address. In accordance with an example, the word line is brought to about 4.5 V, the bit lines are brought to about 0.8 V, while the sources of cells $C_{ij}$ are kept connected to ground GND.

Before the second step 202, i.e., the precharging, each sense node Yms is connected to ground Gnd, for example, by a pull-down circuit not disclosed and not shown as it is of a well-known type. For precharging the terminal Yms, the timing device 7 (LOG-TIM) activates, by the first drive signal Senable (for example, bringing it to the logic value 1), the sense device 5. The sense device 5 would return an output signal Out dependant on the voltage value present at the sense node Yms.

In particular, the sense device 5 is such to be capable of switching from a state wherein the output signal assumes a low logic value, near the ground Gnd voltage, to a high logic value, near the supply Vdd voltage. According to the example considered, initially, the output signal Out has a low logic value.

In the second step 202, the precharging circuit 6 is activated by the second drive signal ON and, in response, provides an electric current to the sense node Yms increasing the voltage thereof. In particular, the activation of the precharging circuit 6 is delayed with respect to the activation of the sense device 5, i.e., it occurs subsequently to the switch-on of the sense device 5.

When the sense node Yms reaches the desired value of voltage, the output signal Out of the sense device 5 switches to a high value. The switching of the sense device 5 ensures that the sense node Yms has reached a desired voltage value of precharging. Upon this switching of the output of the sense device 5, the precharging circuit 6 is deactivated.

In particular, the deactivation of the precharging circuit 6 is carried out by employing the output signal Out itself, which is supplied as an input to the precharging circuit 6 and operates as a deactivation signal (OFF) when it assumes a preset logic value (according to the example, a high value).

Upon the completion of the precharging procedure, a third step 203 (SENSE-LATCH) is started, wherein the "sensing" of each addressed memory cell $C_{ij}$ occurs, which is connected to the sensing terminal Yms. According to an embodiment, the sensing device 5 carries out a comparison between the electric current through the memory cell to be read $C_{ij}$ to a current generated by a reference cell and it produces output data, corresponding to the logic value associated to the output signal Out. The thus generated data is stored in a storing device, such as a latch.

In a fourth step 204 (MULT-OUTPUT) of the reading method 200, the data stored in the latch is multiplied based on the address and carried on an output of the memory system 100. The reading method 200 ends with a symbolic end step END.

Figure 3:
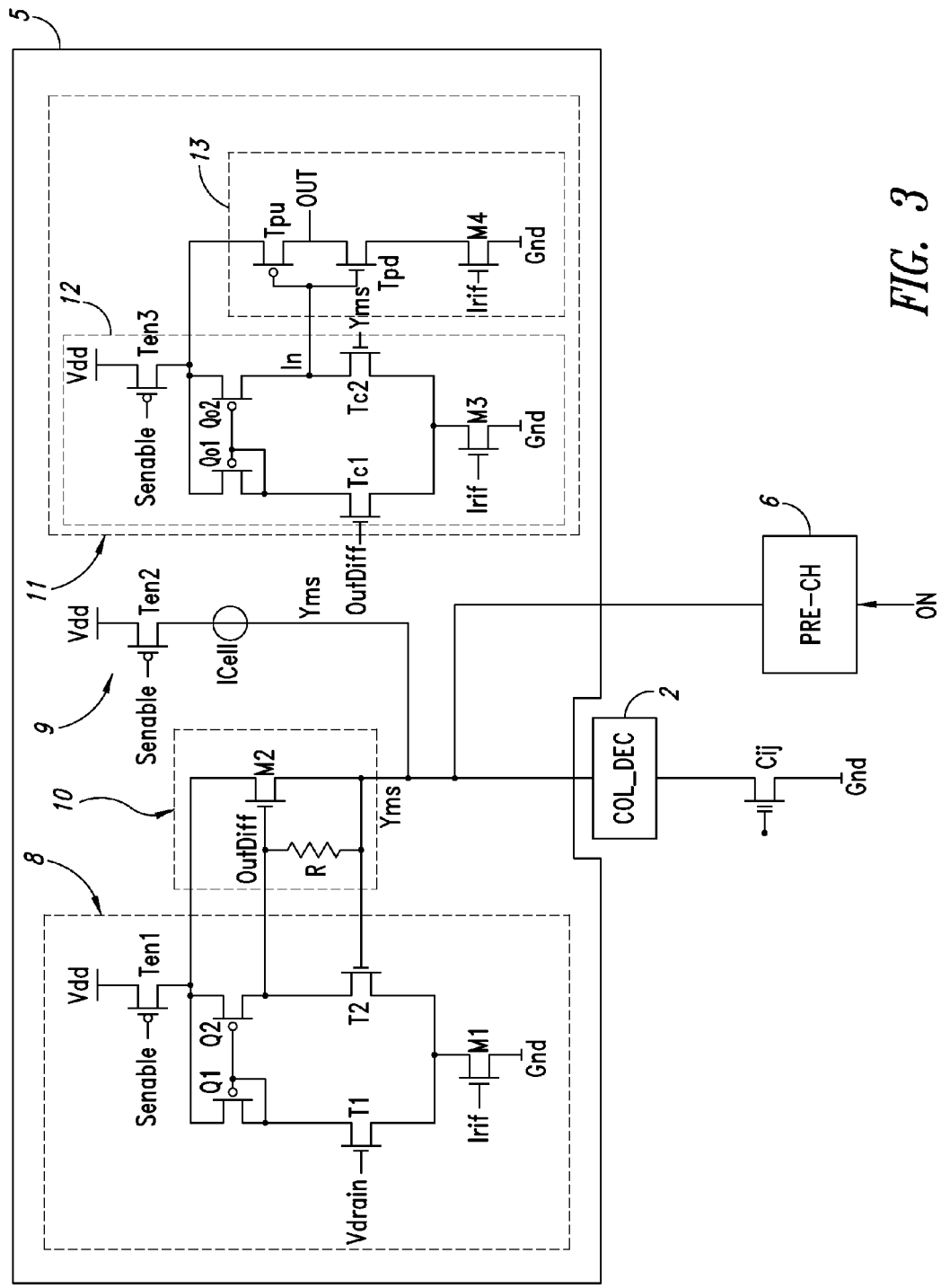
FIG. 3 shows an exemplary circuit scheme of a sense device usable by said memory system.

FIG. 3 shows a particular embodiment of the sense device 5 and has some of the devices of the memory system 100 already shown in FIG. 1. The sense device 5 represented in FIG. 3 may be made in CMOS (Complementary Metal Oxide Semiconductor) technology and it is a sense amplifier, for example of the differential type, comprising: a first differential amplifier 8, a current generator branch 9 for generating a reference current ICell, a combiner block 10 for combining signals and a comparator device 11.

The first differential amplifier 8 comprises a first transistor T1 and a second transistor T2, both, for example of the n-channel type, having respective source terminals connected to a drain terminal of a first bias transistor M1.

The first bias transistor M1 has a source terminal connected to ground Gnd and a gate terminal adapted to receive a control voltage Irif, so that the first bias transistor M1 may provide an adequate bias current to the first and the second transistor T1 and T2.

Moreover, the drain terminals of the first and the second transistors T1 and T2 are connected to drain terminals of a first transistor Q1 and a second transistor Q2 (of the p-channel type) of a first current mirror Q1-Q2. The gate terminal of the first transistor T1 is adapted to receive a reading voltage Vdrain. The gate terminal of the second transistor T2 is connected to the sense node Yms.

The source terminals of transistor Q1 and Q2 of the first current mirror are connected to a terminal supplied by the supply voltage Vdd by a first enabling (p-channel) transistor Ten1 having a gate terminal adapted to receive the first drive signal Senable, for enabling the operation of the sense amplifier 5. The drain terminal of the second transistor T2 is connected to a differential output terminal OutDiff of the first differential amplifier 8.

The branch 9 for generating the reference current ICell comprises a second enabling transistor Ten2, controlled by the first drive signal Senable and supplied by the voltage Vdd. The second enabling transistor Ten2 is such to put the supply terminal in connection with a reference current ICell generator connected to the sense node Yms, representative of a current provided by a reference cell, not shown.

The combiner block 10 comprises a sense transistor M2 (for example of the N-channel type) having a gate terminal connected to the differential output OutDiff, a source terminal connected to the sense node Yms and a drain terminal connected to the drain of the second transistor Q2 of the current mirror Q1-Q2. Moreover the combiner block 10 is provided with a resistive element R (for example a resistor CMOS) connected between the differential output OutDiff and the sense node Yms.

The comparator 11 may include a second differential amplifier 12 and, according to the example, a digital output stage 13. The second differential amplifier 12 is provided with a first conversion transistor Tc1 and a second conversion transistor Tc2 (for example, both of the N-channel type), having respective source terminals connected to a drain terminal of a second bias transistor M3. The second bias transistor M3 has a source terminal connected to the ground terminal Gnd and a gate terminal adapted to receive the control voltage Irif.

The first and second conversion transistors Tc1 and Tc2 have respective drain terminals connected to drain terminals of a third transistor Qo1 and of a fourth (P-channel) transistor Qo2, forming a second current mirror. The gate terminal of the first conversion transistor Tc1 is connected to the differential output OutDiff. The gate terminal of the second conversion transistor Tc2 is connected to the sense node Yms.

The source terminals of the third and fourth transistors Qo1 and Qo2 of the second current mirror are connected to a terminal supplied with the supply voltage Vdd by a third (P-channel) enabling transistor Ten3 having a gate terminal adapted to receive the first drive signal Senable. The drain terminal of the second conversion transistor Tc2 is connected to an input terminal In of the digital output stage 13.

The digital output stage 13 comprises, for example, an inverter including a (N-channel) pull-down transistor Tpd and a (P-channel) pull-up transistor Tpu each having a gate terminal connected to the input In. The drain terminal of the pull-down transistor Tpd is connected to a drain terminal of the pull-up transistor Tpu and to a digital output terminal Out connected directly, according to the example, to the precharging circuit 6.

The source terminal of the pull-down transistor Tpd is connected to a third bias transistor M4, which has the source terminal connected to the ground terminal Gnd, whereas its own gate terminal is adapted to receive the control voltage Irif. The source terminal of the pull-up transistor Tpu is connected to the source terminals of the third and fourth transistors Qo1 and Qo2 of the second current mirror.

Figure 4:
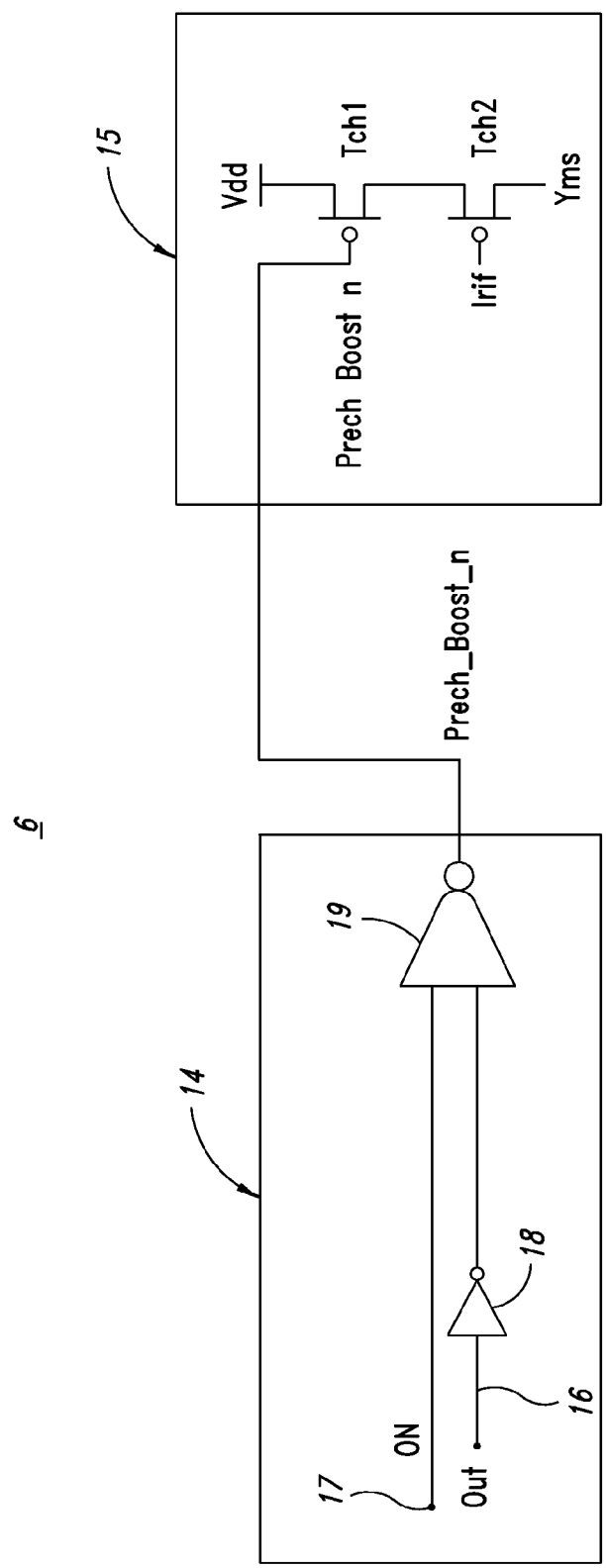
FIG. 4 shows an exemplary circuit scheme of a precharging circuit usable in said sense device.

FIG. 4 shows an exemplary embodiment of the precharging circuit 6 usable in the memory system 100 and comprising a drive signal combiner 14 and a voltage booster 15. The signal combiner 14 (also referred to as signal combining logic module) can be made, for example, by a logic gate module and comprises a first input 16 adapted to receive the output digital signal Out from the sense device 5 and a second input 17 adapt to receive the second drive signal ON.

The first input 16 is connected to a NOT-gate 18 whose output is connected to a NAND gate 19 which receives also the second drive signal ON. One output of the NAND gate returns a combined signal Prech_Boost_n which drives the activation and the deactivation of the voltage booster 15.

The voltage booster 15 (also referred to as a precharging current generating circuit) comprises a first charging transistor TCh1 (for example, of the P-channel type), having a source terminal connected to the supply terminal Vdd and a gate terminal adapted to receive the combined signal Prech_Boost_n. Moreover, the voltage booster 15 comprises a second (P-channel) charging transistor Tch2 having a source terminal connected to the drain terminal of the first charging transistor Tch1 and a drain terminal connected to the sense node Yms. The gate terminal of the second charging transistor Tch2 is controlled by means of the voltage signal Irif.

Below a particular embodiment of the reading method 200 will be disclosed, which may be implemented by employing the sense device 5 and the precharging circuit illustrated in FIGS. 3 and 4, respectively. Particular reference will be made to the second step 202, during which the precharging takes place, and to the third step 203 (SENSE-LATCH) wherein the sensing of the memory cell $C_{ij}$ takes place.

At the end of the first step 201, the sense node Yms is connected to ground Gnd. In the second step 201, the timing device 7 activates the first drive signal Senable (according to the example, it assumes a low value), which, by switching on the enabling transistors Ten1-Ten3, activates the sense device 5, connecting it to the supply terminal Vdd.

Under these conditions, the first differential amplifier 8 is unbalanced, since the voltage difference, applied to the gate terminals of the first transistor T1 and the second transistor T2 is equal to the voltage Vdrain applied to the gate terminal of the first transistor T1. The bias current provided by the first bias transistor M1 is used for charging the differential output OutDiff, in particular, by means of the sense transistor M2.

Under these operative conditions there are three current contributions which charge the sense node Yms: a first current contribution which comes from the resistive element R, a second current contribution provided by the sense transistor M2 and a third current contribution from the branch 9 for generating the reference current ICell.

Figure 5:
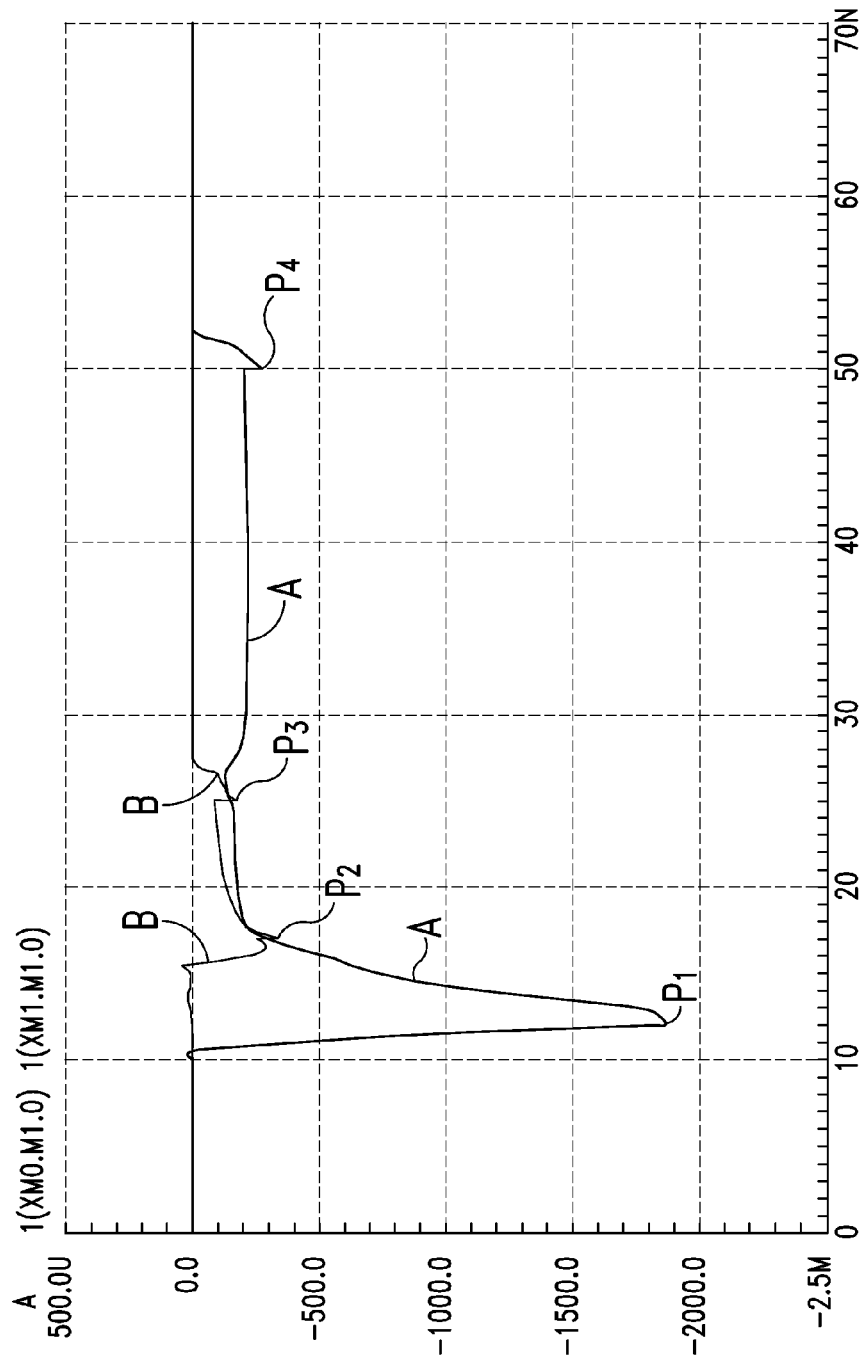
FIG. 5 shows two curves, obtained as a result of simulations of reading operations, representative of the current absorption associated to the switch-on/off of a sense device and the precharging circuit.

FIG. 5 shows, curve A, the trends of the current involving the first differential amplifier 8. Upon the switch-on of the first differential amplifier 8, a first current peak P1 occurred.

It is to be noticed that when the electric voltage of the sense node Yms is lower than the Vdrain value, the voltage at the differential output OutDiff is higher than the electric voltage of the sense node Yms. Until the sense node Yms exceeds the Vdrain value, the first conversion transistor Tc1 of the second differential amplifier 12 is ON, such to increase the input In voltage (due to the action of the second current mirror Qo1-

Qo2). Therefore, at the inverter 13 output there will be a low logic-level signal Out. The signal Out is the applied to the first input 16 of the precharging circuit 6 (FIG. 4), where it is inverted by the NOT gate 18.

The timing device 7 activates the second drive signal ON such to activate the precharging circuit 6. The second drive signal ON is brought, for example, to a high logic level. Therefore, with reference to FIG. 4, to the NAND gate 19, two high logic-level signals are applied, to produce a combined low logic value signal Prech_Boost_n and, therefore, such to drive the switch-on of the charging transistor Tch1 which proceeds to inject current to the sense node Yms, increasing its voltage and accelerating is precharging step.

It is to be noticed, as said above, that the activation of the precharging circuit 6, through the activation of the second drive signal ON is, in particular, asynchronous and delayed, with respect to the activation of the sense device 5, carried out by the first drive signal Senable. As may be observed from FIG. 5, curve B, after the precharging circuit 6 is switched on, a current absorption occurs which presents a second peak P2.

For example, the delay in switching on the precharging circuit 6 with respect to that of the sense device 5 is sized so that the precharging may occur in reasonable times, such as, for example, 15-20 ns and also minimizing the duration of the activation of the precharging circuit 6. For example, it may be provided that the precharging circuit 6 is switched on 4-5 ns after the sense device 5 is switched on.

Due also to the action of the precharging circuit 6, the sense node Yms reaches the reading voltage Vdrain. Therefore, the first differential amplifier 8 will be balanced and the only current contribution entering the sense node Yms is that due to the branch 9 for generating a reference current ICell, which represents the current to be used for the comparison with the cell to be read $C_{ij}$. In such a situation, considering that the cell to be read $C_{ij}$, has not been selected yet, the reference current ICell circulates through the resistive element R and closes at the ground terminal Gnd by the first bias transistor M1, generating a slight unbalancing of the first differential amplifier 8. Thereby, the voltage of the sense node Yms is higher than that on the differential output Outdiff.

When the current of the node Yms is higher than the voltage on the differential output OutDiff, the comparator 11 switches, returning a high logic value on the output Out. In fact, the increase of the voltage of the sense node Yms activates the second conversion transistor Tc2 which connects to ground Gnd, through the third bias transistor M3, reducing the voltage on the input In of the inverter 13, which would return a high logic value on the output Out.

Switching to a high logic value of the output Out, applied to the precharging circuit 6, causes the signal exiting the NOT gate 18 to assume a low logic value. Therefore, the combined signal Prech_Boost_n exiting the NAND gate 19 assumes a high logic value, deactivating the first charging transistor Tch1. Thereby, the precharging circuit 6 is deactivated (see the third current peak P3 of curve B in FIG. 5). Subsequently, for example after a time equal to some hundreds of ps, the first drive signal ON is deasserted (brought to a low logic value), such to keep the precharging circuit 6 deactivated during the reading of the cell $C_{ij}$.

The third step 203 may then start, wherein the drain terminal of the memory cell $C_{ij}$ is put in connection with the sense node Yms. If the memory cell $C_{ij}$ absorbs a higher current than the reference current ICell, the voltage of the sense node Yms will fall below the voltage value on the differential output OutDiff, causing the commutation of the output Out of the inverter 13 which will move from a high logic value to a low logic value (for example, close to the ground voltage). If the memory cell $C_{ij}$ absorbs a lower current of the reference current ICell, the voltage of the sense node Yms will remain higher than the voltage value present on the differential output OutDiff; in such a situation, the output Out will remain close to the high logic value, Vdd.

When reading the cell is completed, the first drive signal Senable, is brought to such a value (high logic value) to deactivate the enabling transistors Ten1-Ten3 and therefore switch off the sense device 5. Upon such a switch-off, another current peak P4 occurs, relative to curve A in FIG. 5.

Observing the FIG. 5 it may be appreciated that in the operation 200 of the reading circuit 4 four current peaks, asynchronous to each other, occur. The first current peak P1 occurs upon switching on the sense device 5; the second current peak P2 occurs upon switching on the precharging circuit 6, the third current peak P3 occurs upon switching off the precharging circuit 6 and the fourth current peak P4 occurs upon switching off the sense amplifier 5.

The embodiments disclosed have relevant advantages in respect to the prior solutions.

Handling the precharging circuit 6 asynchronously in respect to the sense device 5 has advantages both in terms of the noise on the supplies and in terms of reducing the average consumption. In particular, switching off the precharging circuit 6 upon switching the output Out of the sense device 5, reduces the average consumption of the whole memory system 100.

This leads to benefits both as to the consumption under operative conditions and as to the better performance of the sense device 5 and such a result is attributable to the reduction of the operation dynamics within the range Vdd-Gnd, due to a smaller average increase of the ground voltage consequent the current injections. Also the delayed switch-on of the precharging circuit 6 in respect to that of the sense device 5 results in advantages in terms of reducing the consumption noise.

The disclosed embodiments are also applicable to memory systems with high loads of bit lines (for example, higher than 1 Gbit) since they allow one to obtain an acceleration of the precharging step by providing an auxiliary current contribution time-distributed so as not to increase the noise on the power supplies. Advantageously, for memory systems loaded with standard bit line (for example, lower than 500 Mbit) a restriction of noise may be obtained upon switching on the sense device 5, since the contribution of the precharging circuit 6 allows to decrease the current to be provided through the sense device itself.

It is to be observed that the intervention of the precharging circuit 6, which generates an auxiliary current, allows to reduce the precharging current provided by the first differential amplifier 8, reducing the noise induced on the power supplies upon switching on the sense device 5.

The various embodiments described above can be combined to provide further embodiments. All of the U.S. patents, U.S. patent application publications, U.S. patent application, foreign patents, foreign patent application and non-patent publications referred to in this specification are incorporated herein by reference, in their entirety. Aspects of the embodiments can be modified, if necessary to employ concepts of the various patents, application and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A circuit for reading non-volatile memory cells, comprising:
   a sense node configured to be coupled to a memory cell to be read;
   a sense device coupled to the sense node and configured to provide an output signal with logic values depending on an electric signal present at the sense node;
   a precharging circuit coupled to said sense node and configured to charge said sense node to a precharging voltage; and
   a timing device configured to activate said sense device with a first control signal and activate the precharging circuit with a precharge activation signal, delayed from the activation of the sense device, wherein said precharging circuit comprises:
      a signal combining logic module configured to receive a second control signal and the output signal and provide an activation/deactivation signal based on the second control and output signals; and
      a precharging current generating circuit configured to be activated and deactivated based on said activation/deactivation signal and configured to provide a precharging current to charge said sense node to the precharging voltage.

2. A circuit according to claim 1, wherein the timing device is configured to activate the sense device in a precharging step that precedes a cell reading step and the precharging circuit is configured to be deactivated upon a switching of said output signal in the precharging step.

3. A circuit according to claim 1, wherein said sense device is configured to read the memory cell after said sense node is charged to the precharging voltage; the output signal of the sense device being indicative of a cell reading logic value.

4. A circuit according to claim 3, wherein the timing device is further configured to provide, after the memory cell is read, the first control signal configured to deactivate the sense device.

5. A circuit according to claim 1, wherein the sense device includes an output terminal configured to provide the output signal and coupled to a control terminal of said precharging circuit; said precharging circuit being configured to be deactivated by said output signal.

6. A circuit according to claim 1, wherein the sense device comprises:
   a control terminal for receiving the first control signal;
   a differential amplifier having a first input terminal coupled to receive a reading voltage, a second input terminal coupled to the sense node, and an output terminal;
   a reference branch configured to provide a reference current to the sense node; and
   a comparator having a first input coupled to said sense node, a second input coupled to the output terminal of the differential amplifier, and an output configured to provide said output signal.

7. A circuit according to claim 6, wherein the sense device includes:
   a switch having a first conduction terminal coupled to a bias terminal of the differential amplifier, a second conduction terminal coupled to the sense node, and a control terminal coupled to the output terminal of the differential amplifier; and
   a resistor positioned between and coupled to the control and second conduction terminals of the switch.

8. A memory system comprising:
   a memory array that includes a plurality of memory cells to be read;
   a row address decoder coupled to said memory array;
   a column address decoder coupled to said memory array;
   a read circuit coupled to the memory array and configured to read the memory cells, the read circuit including:
      a sense node coupled to a selected memory cell of the memory cells;
      a sense device coupled to the sense node and configured to provide an output signal with logic values depending on an electric signal present at the sense node;
      a precharging circuit coupled to said sense node and configured to charge said sense node to a precharging voltage; and
      a timing device configured to activate said sense device with a first control signal and activate the precharging circuit with a precharge activation signal, delayed from the activation of the sense device, wherein said precharging circuit comprises:
         a signal combining logic module configured to receive a second control signal and the output signal and provide an activation/deactivation signal based on the second control and output signals; and
         a precharging current generating circuit configured to be activated and deactivated based on said activation/deactivation signal and configured to provide a precharging current to charge said sense node to the precharging voltage.

9. A memory system according to claim 8, wherein the timing device is further configured to provide, after the memory cell is read, the first control signal configured to deactivate the sense device.

10. A memory system according to claim 8, wherein the sense device includes an output terminal configured to provide the output signal and coupled to a control terminal of said precharging circuit; said precharging circuit being configured to be deactivated by said output signal.

11. A memory system according to claim 8, wherein the sense device comprises:
   a control terminal for receiving the first control signal;
   a differential amplifier having a first input terminal coupled to receive a reading voltage, a second input terminal coupled to the sense node, and an output terminal;
   a reference branch configured to provide a reference current to the sense node; and
   a comparator having a first input coupled to said sense node, a second input coupled to the output terminal of the differential amplifier, and an output configured to provide said output signal.

12. A circuit according to claim 11, wherein the sense device includes:
   a switch having a first conduction terminal coupled to a bias terminal of the differential amplifier, a second conduction terminal coupled to the sense node, and a control terminal coupled to the output terminal of the differential amplifier; and
   a resistor positioned between and coupled to the control and second conduction terminals of the switch.

13. A circuit for reading non-volatile memory cells, comprising:
   a sense node configured to be coupled to a memory cell to be read;
   a sense device coupled to the sense node and configured to provide an output signal with logic values depending on an electric signal present at the sense node;
   a precharging circuit coupled to said sense node; and a timing device configured to activate said sense device with a first control signal, activate the precharging circuit with a precharge activation signal that is delayed with respect to the first control signal, keep the sense device and precharging circuit active during a precharging phase, and keep the sense device active during a read phase that follows the precharge phase, wherein the precharging circuit and sense device are configured to charge said sense node to a precharging voltage during the precharging phase.

14. A circuit according to claim 13, wherein the precharging circuit is configured to be deactivated by said output signal when the output signal changes logic value in response to the sense node being charged to the precharging voltage.

15. A circuit according to claim 13, wherein:
said sense device is configured to read the memory cell after the sense node is charged to the precharging voltage;
the output signal of the sense device is indicative of a cell reading logic value; and
the timing device is further configured to provide, after the memory cell is read, the first control signal configured to deactivate the sense device.

16. A circuit according to claim 13, wherein the sense device includes an output terminal configured to provide the output signal and coupled to a control terminal of said precharging circuit; said precharging circuit being configured to be deactivated by said output signal.

17. A circuit according to claim 13, wherein said precharging circuit comprises:

a signals combining logic module configured to receive a second control signal and the output signal and provide an activation/deactivation signal based on the second control and output signals; and
a precharging current generating circuit configured to be activated and deactivated based on said activation/deactivation signal and configured to provide a precharging current to charge said sense node to the precharging voltage.

18. A circuit according to claim 17, wherein the sense device comprises:
a control terminal for receiving the first control signal;
a differential amplifier having a first input terminal coupled to receive a reading voltage, a second input terminal coupled to the sense node, and an output terminal;
a reference branch configured to provide a reference current to the sense node; and
a comparator having a first input coupled to said sense node, a second input coupled to the output terminal of the differential amplifier, and an output configured to provide said output signal.

19. A circuit according to claim 18, wherein the sense device includes:
a switch having a first conduction terminal coupled to a bias terminal of the differential amplifier, a second conduction terminal coupled to the sense node, and a control terminal coupled to the output terminal of the differential amplifier; and
a resistor positioned between and coupled to the control and second conduction terminals of the switch.

* * * * *